United States Patent
Pfeuffer

(10) Patent No.: US 8,436,610 B2
(45) Date of Patent: May 7, 2013

(54) PERFUSION ADAPTIVE BLOOD PROTON SPIN TAGGED MR IMAGE DATA PROCESSING SYSTEM

(75) Inventor: Josef Pfeuffer, Kunreuth (DE)

(73) Assignee: Siemens Medical Solutions USA, Inc., Malvern, PA (US)

(*) Notice: Subject to any disclaimer, the term of this patent is extended or adjusted under 35 U.S.C. 154(b) by 637 days.

(21) Appl. No.: 12/604,273

(22) Filed: Oct. 22, 2009

(65) Prior Publication Data

US 2010/0141254 A1 Jun. 10, 2010

Related U.S. Application Data

(60) Provisional application No. 61/120,963, filed on Dec. 9, 2008.

(51) Int. Cl.
*G01R 33/56366* (2006.01)
*G01R 33/563* (2006.01)
*G01R 33/5601* (2006.01)
*G01R 33/5635* (2006.01)
*A61B 5/055* (2006.01)

(52) U.S. Cl.
USPC ............ 324/306; 324/318; 600/410; 600/419

(58) Field of Classification Search .......... 324/300–322; 600/407–435; 382/128–131
See application file for complete search history.

(56) References Cited

U.S. PATENT DOCUMENTS

| | | | | |
|---|---|---|---|---|
| 4,621,234 A | * | 11/1986 | Caprihan | 324/306 |
| 6,037,771 A | * | 3/2000 | Liu et al. | 324/309 |
| 6,265,873 B1 | * | 7/2001 | Le Roux | 324/309 |
| 6,271,665 B1 | * | 8/2001 | Berr et al. | 324/306 |
| 6,564,080 B1 | * | 5/2003 | Kimura | 600/410 |
| 6,801,034 B2 | * | 10/2004 | Brittain et al. | 324/309 |
| 7,328,054 B2 | * | 2/2008 | Jesmanowicz | 600/410 |
| 7,545,141 B2 | * | 6/2009 | Kimura | 324/306 |
| 7,579,834 B2 | | 8/2009 | Yui | |
| 7,627,359 B2 | * | 12/2009 | Yarnykh et al. | 600/410 |
| 8,121,668 B2 | * | 2/2012 | Sutton et al. | 600/419 |
| 8,195,274 B2 | * | 6/2012 | Wong | 600/419 |
| 8,260,396 B2 | * | 9/2012 | Guenther | 600/410 |
| 2004/0162483 A1 | * | 8/2004 | Kimura | 600/419 |
| 2004/0204643 A1 | * | 10/2004 | Jesmanowicz | 600/410 |
| 2006/0184002 A1 | * | 8/2006 | Yarnykh et al. | 600/410 |

(Continued)

*Primary Examiner* — Melissa Koval
*Assistant Examiner* — Tiffany Fetzner
(74) *Attorney, Agent, or Firm* — Alexander J Burke

(57) ABSTRACT

A system adaptively processes MR image data to accommodate variation in perfusion time of a vessel fluid. An MR image data acquisition device initiates acquisition of a first image set comprising multiple different individual images having a set of corresponding different physical slice locations through a patient anatomical volume and being acquired at a corresponding first set of times and in a first order relative to a time of blood tagging of a patient. The MR image data acquisition device initiates acquisition of a second image set comprising multiple different individual images having the set of corresponding different physical slice locations through the patient anatomical volume and being acquired at substantially the corresponding first set of times and in a second order, different to the first order, relative to the time of blood tagging of the patient. At least one computer combines and averages image data representing the same corresponding image slice in both the first and second image sets and acquired at different times relative to the time of blood tagging of the patient and sends the combined and averaged image data representing the same corresponding image slice to a destination.

19 Claims, 6 Drawing Sheets

U.S. PATENT DOCUMENTS

| | | | |
|---|---|---|---|
| 2008/0269595 A1* | 10/2008 | Wong | 600/411 |
| 2009/0149733 A1* | 6/2009 | Guenther | 600/410 |
| 2010/0030062 A1* | 2/2010 | Bolar et al. | 600/419 |
| 2010/0141254 A1* | 6/2010 | Pfeuffer | 324/309 |
| 2010/0240983 A1* | 9/2010 | Jung et al. | 600/410 |
| 2012/0271157 A1* | 10/2012 | Wong et al. | 600/419 |

\* cited by examiner

10

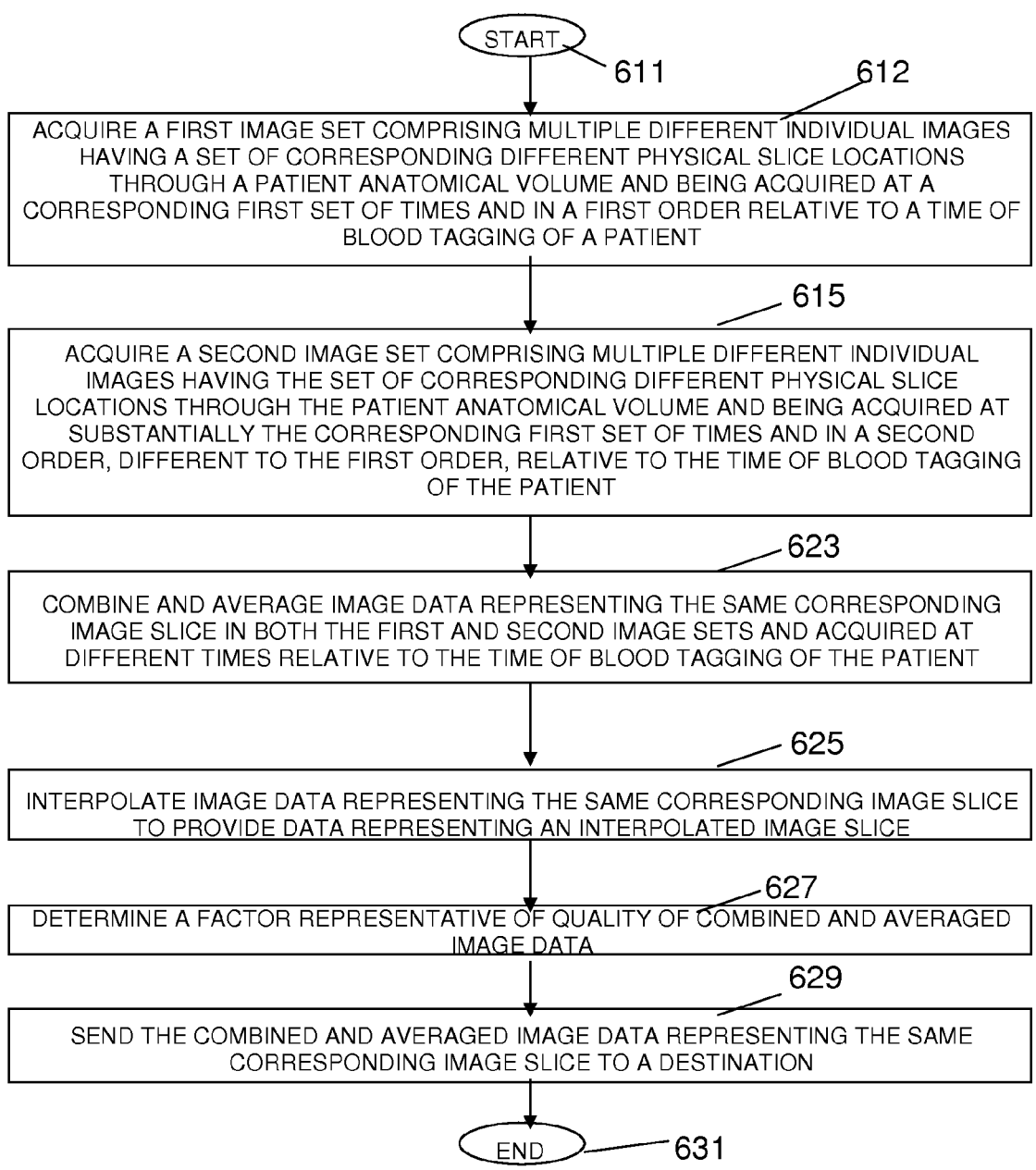

PERFUSION ADAPTIVE BLOOD PROTON SPIN TAGGED MR IMAGE DATA PROCESSING SYSTEM

This is a non-provisional application of provisional application Ser. No. 61/120,963 filed Dec. 9, 2008, by J. Pfeuffer.

FIELD OF THE INVENTION

This invention concerns a system for adaptively processing MR image data to accommodate variation in perfusion time of a vessel fluid such as tagged blood (e.g., labeled by Arterial Spin labeling (ASL)) or contrast agent).

BACKGROUND OF THE INVENTION

MR perfusion methods are used to measure blood flow in different body regions such as cerebral blood flow (CBF) in a patient head. One set of MR methods uses injection of contrast agents like Gadolinium in the blood to measure the wash-in and wash-out behaviour in imaged slices of patient anatomy such as in the brain. Another set of MR methods does not require a contrast agent, but uses magnetic tagging of blood, e.g., by applying magnetically inverted spins in blood in the neck for use as an "intrinsic contrast agent" referred to as arterial spin labelling (ASL). In ASL, blood with the tagged spins perfuses into an anatomical region of interest (ROI), where it is measured with fast MR imaging methods. In ASL, images are most often acquired with a perfusion-sensitive preparation (tag) image and non-perfusion-sensitive (control) image. For quantification of CBF, multiple experimental and physiological parameters have to be properly calibrated and taken into account. Pulsed ASL (PASL) methods use a short inversion pulse for tagging. For example, a 10 cm inversion slice is placed in the neck region and image slices are acquired from parts of the brain tissue.

Inversion time (TI) is the delay time between an MR inverting pulse and a slice read out time as indicated by an RF excitation pulse (and corresponding RF echo pulse). At present, perfusion quantification is used to account for different $TI^{SLICE}$ (by applying an inverted factor $\Delta M^{CORRECTED} = \Delta M \cdot \exp(\Delta TI/T1')$), which normalizes difference in $TI^{SLICE}$ for different slices relative to a first slice designated $TI^{SLICE-1}$. This is valid and gives substantially correct CBF values, if a bolus (tagged blood or contrast agent) arrives in time in regions of a slice that is imaged and is fully collected. This model is valid for a maximum transit time $\Delta t$ up to $(TI^{SLICE-1}-\tau) < 0.8$ at a first slice. However, pathological retardation and slower circulation in brain regions may make bolus transit times larger than the maximum transit time and the model calculation underestimates the true CBF in these regions. It is known that a global value of CBF is reduced and increased transit times occur in elderly humans or in stroke patients where transit times may exceed 1 second. It has been shown in multiple TI times measured for the same slice in a healthy human brain that in some regions the model and quantification fit well, but in other regions considerable bolus dispersion and latency are observed.

A known system for addressing this problem involves acquisition of multiple inversion times (TI) but, for example, 10 inversion time points increase experiment imaging time 10-fold to approx. 36 min (compared to a typical four minute PASL scan). Further, such a known system involves the definition of brain regions in ROI data which requires a first manual or automated brain segmentation and the fitting of different kinetic models to ROI data (standard model, Hrabe model, extended model incorporating tag bolus width). A single voxel model fit is too noisy. Known systems addressing the problem of unknown prolonged or dispersed bolus transit time in healthy and pathological conditions require considerable experimental and computational effort and imaging time. Measurement times that are much longer than 5-10 minutes are often not feasible for clinical applications due to limited time available and due to the potential accumulation of artefacts (e.g., resulting from patient motion during scans). A system according to invention principles addresses these deficiencies and associated problems.

SUMMARY OF THE INVENTION

An MR imaging system improves the acquisition order and calculation of a series of perfusion images taking into account different inversion times in the real time (continuously updated) calculation or post-processing generation of perfusion image maps for perfusion of a vessel fluid such as tagged blood (e.g., labeled by Arterial Spin labeling (ASL)) or contrast agent. A system adaptively processes MR image data to accommodate variation in perfusion time of a vessel fluid. An MR image data acquisition device initiates acquisition of a first image set comprising multiple different individual images having a set of corresponding different physical slice locations through a patient anatomical volume and being acquired at a corresponding first set of times and in a first order relative to a time of blood tagging of a patient. The MR image data acquisition device initiates acquisition of a second image set comprising multiple different individual images having the set of corresponding different physical slice locations through the patient anatomical volume and being acquired at substantially the corresponding first set of times and in a second order, different to the first order, relative to the time of blood tagging of the patient. At least one computer combines and averages image data representing the same corresponding image slice in both the first and second image sets and acquired at different times relative to the time of blood tagging of the patient and sends the combined and averaged image data representing the same corresponding image slice to a destination.

BRIEF DESCRIPTION OF THE DRAWING

FIG. 6 shows a flowchart of a process performed by a system for adaptively processing MR image data to accommodate variation in perfusion time of a vessel fluid, according to invention principles.

DETAILED DESCRIPTION OF THE INVENTION

A system improves the acquisition order and calculation of a series of perfusion images taking into account different inversion times in the calculation of perfusion image maps. In ASL, images are most often acquired with a perfusion-sensitive preparation (tag) image and non-perfusion-sensitive (control) image. To calculate a perfusion image map, typically the difference of tag and control image is taken with appropriate scaling factors. The resultant perfusion image maps are generated in real-time and are updated during progress of an imaging examination. Alternatively, the system may be employed after measurement is completed for offline image data post-processing. The system is usable with pulsed ASL (PASL) MR methods, which use a short inversion pulse for blood tagging. For example, image slices are acquired from parts of the brain tissue in response to a 10 cm inversion slice being applied to a patient neck region. In other embodiments the system is employed when a different ASL technique is used. or when a contrast agent is introduced into a patient.

The system employs pulsed ASL (PASL) using an inversion pulse for blood tagging (e.g., using known echo-planar imaging (EPI) and signal targeting with alternating RF (EPISTAR), flow-sensitive alternating inversion recovery (FAIR) or proximal inversion with a control for off-resonance effects (PICORE) methods) and a tag saturation module to determine temporal duration of a tag (e.g., using quantitative imaging of perfusion and a single subtraction (QUIPSS) and with thin section $TI_1$ periodic saturation (Q2TIPS) methods).

Figure 1:
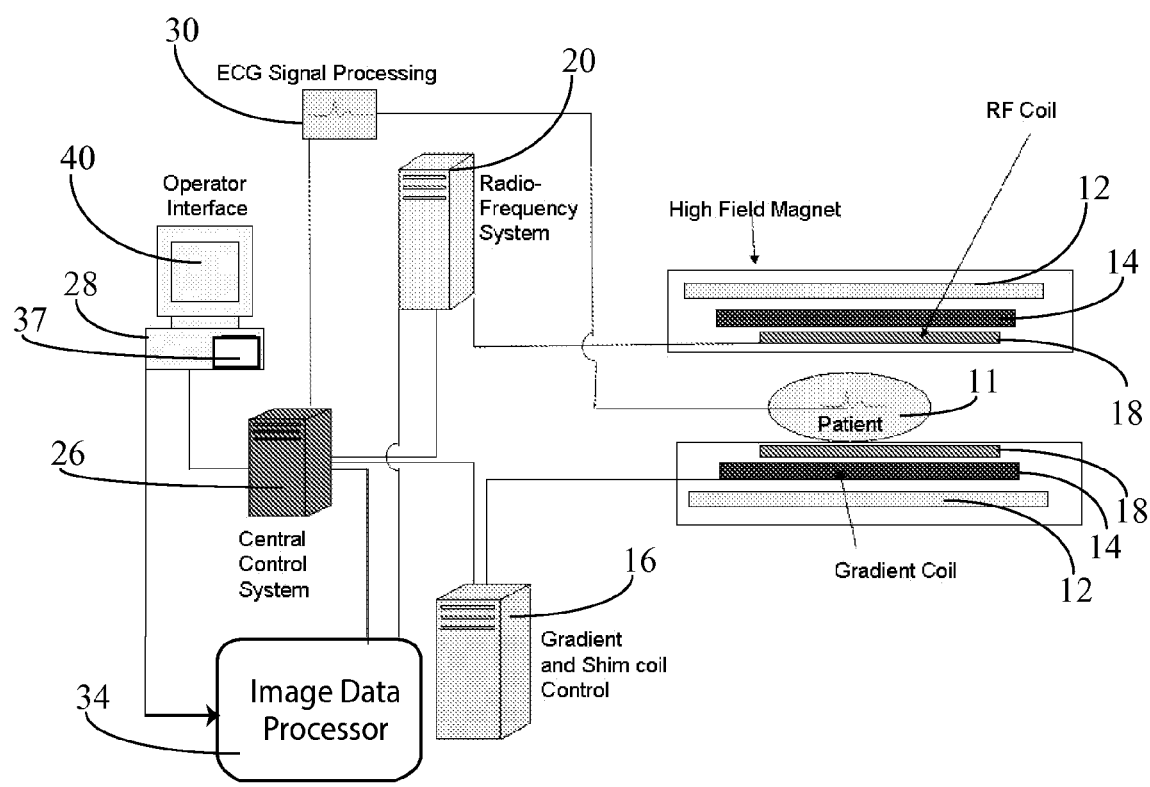
FIG. 1 shows a system for adaptively processing MR image data to accommodate variation in perfusion time of a vessel fluid, according to invention principles.

FIG. 1 shows system 10 for adaptively processing MR image data to accommodate variation in perfusion time of a vessel fluid. System 10 employs an ECG synchronization signal generator 30 for use in synchronizing image acquisition to a desired point within a heart cycle, for example. In system 10, magnet 12 creates a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient module 16, produce position dependent magnetic field gradients in three orthogonal directions. The magnetic field gradients include a slice-selection gradient magnetic field, a phase-encoding gradient magnetic field and a readout gradient magnetic field that are applied to patient 11. Further RF (radio frequency) generator 20 provides RF pulse signals to RF coil 18, which in response produces magnetic field pulses which rotate the spins of the protons in the imaged body 11 by ninety degrees or by one hundred and eighty degrees for so-called "spin echo" imaging, or by angles less than or equal to 90 degrees for gradient echo imaging. Pulse sequence controller 16 in conjunction with RF module 20 as directed by central control system 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives MR signals, i.e., signals from the excited protons within the body as they return to an equilibrium position established by the static and gradient magnetic fields. RF pulse generator 20 generates an RF excitation pulse sequence having a pulse repetition interval. Read-out gradient magnetic field generator 14 generates a read-out gradient magnetic field, in response to gradient signals supplied by gradient module 16. A data acquisition device in RF pulse generator 20 acquires RF echo data generated in response to the RF excitation pulse sequence and a controller in generator 20 directs acquisition and processing of the RF echo data.

The MR signals detected and processed by a detector within RF module 20 provide image representative data to image data processor 34. In system 10 image data processor 34 acquires an anatomical imaging data set representing a slice of patient 11 anatomy. MR image data acquisition device 10 initiates acquisition by processor 34 of, a first image set comprising multiple different individual images having a set of corresponding different physical slice locations through a patient anatomical volume and being acquired at a corresponding first set of times and in a first order relative to a time of blood tagging of a patient. Device 10 initiates acquisition of a second image set comprising multiple different individual images having the set of corresponding different physical slice locations through the patient anatomical volume and that are acquired at substantially the corresponding first set of times and in a second order, different to the first order, relative to the time of blood tagging of the patient. Processor 34 comprises at least one computer that combines and averages image data representing the same corresponding image slice in both the first and second image sets and acquired at different times relative to the time of blood tagging of the patient. Processor 34 sends the combined and averaged image data representing the same corresponding image slice to a destination.

Display processor 37 in computer 28 generates data representing at least one two dimensional display image using the combined and averaged image data. Central control unit 26 uses information stored in an internal database comprising predetermined pulse sequence and strength data as well as data indicating timing, orientation and spatial volume of gradient magnetic fields to be applied in imaging and adjusts other parameters of system 10, so as to process the detected MR signals in a coordinated manner to generate high quality images of a selected slice (or slices) of the body. Generated images are presented on display 40. Computer 28 includes a graphical user interface (GUI) enabling user interaction with central controller 26 and enabling user modification of magnetic resonance imaging signals in substantially real time. A data acquisition device in unit 20, in conjunction with processor 34 and display processor 37, processes the magnetic resonance signals to provide image representative data for display on display 40, for example.

Figure 2A:
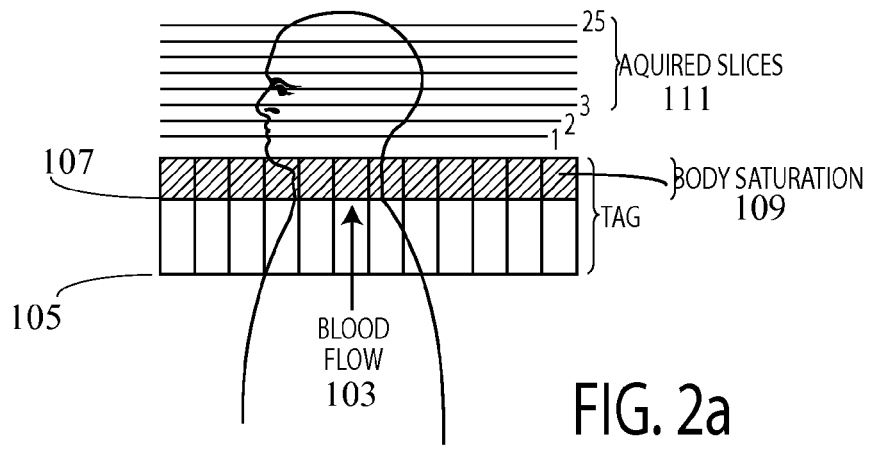
FIG. 2a illustrates spatial application of inversion pulse, tag saturation pulses and imaging slices having a corresponding temporal sequence shown in FIG. 2b and an associated corresponding quantified CBF shown in FIG. 2c, according to invention principles.
Figure 2B:
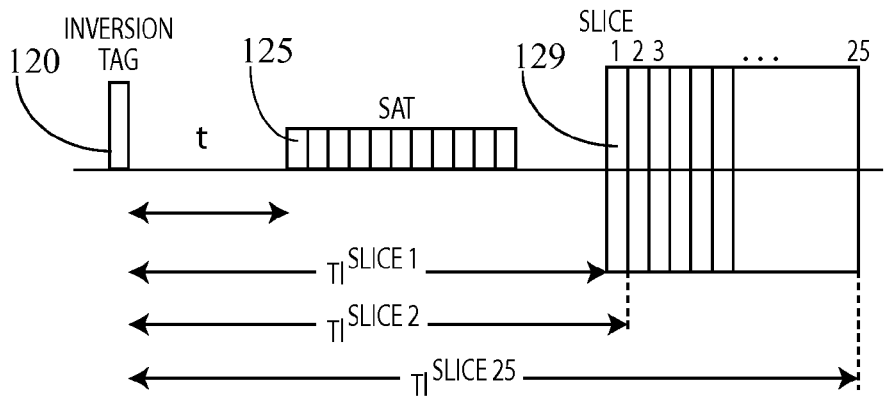

FIG. 2a illustrates spatial application of an inversion pulse at a point 105 to tag blood flow 103 into a patient neck slice 107 and shows tag saturation 109 of slice 107. MR images are acquired of imaging slices 111. FIG. 2b shows a corresponding temporal sequence of inversion pulse 120, tag saturation pulses 125 and imaging slices 129. Inversion time (TI) is the delay time between an MR inverting pulse and a slice read out time as indicated by an RF excitation pulse (and corresponding RF echo pulse) and $TI^{SLICE\_1}$=inversion time of slice 1, typically 1500 ms, for example. Other inversion times include $TI^{SLICE\_2}$, $TI^{SLICE\_3}$, ..., $TI^{SLICE\_N}$ of slice 2, 3, ... N and $TI^{SLICE\_25}$=2700 ms for N=25 slices. Further, τ=bolus cut off time and determines bolus duration, typically 700 ms, for example.

Figure 2C:
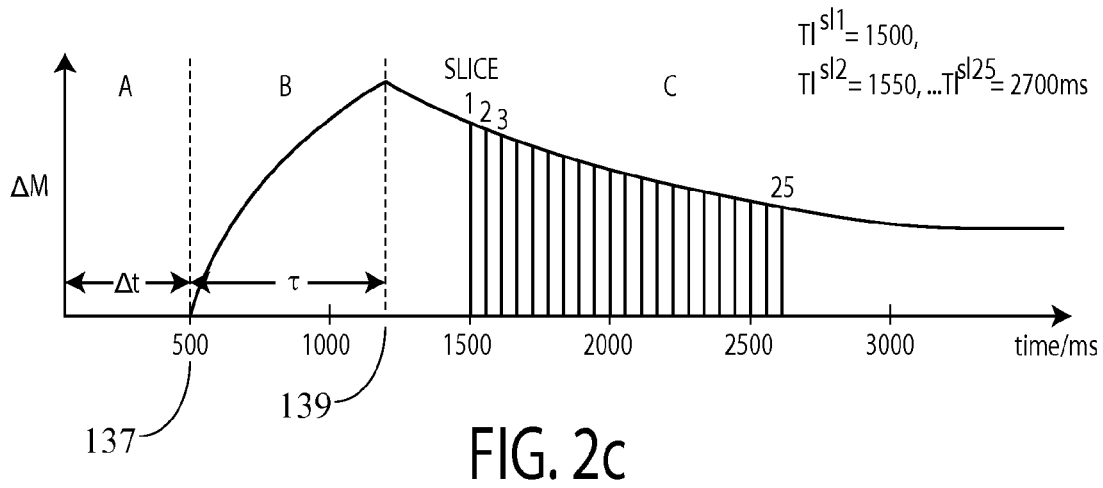

FIG. 2c shows cerebral blood flow (CBF) and a model used to quantify the CBF. After a transit time Δt, the first tagged blood conveying the inverted blood spins of the bolus arrive at the slice, typically 500 ms (137) in a healthy, adult brain. During the time (Δt+τ(139)), in our example between 500 ms and 1200 ms (τ=700 ms), the bolus accumulates in the slice and results in a depicted increase in perfusion signal ΔM (representing cerebral blood flow) according to a function ΔM~t.exp(-t/T1'). At time (Δt+τ(139)) the perfusion signal ΔM has reached a maximum. After the time (Δt+τ) the perfusion signal ΔM undergoes longitudinal relaxation as modelled with an effective relaxation time T1' according to function ΔM~exp(−t/T1') where T1' depends on T1 of tissue and blood depending on detailed model assumptions. Different image slices are acquired at different inversion times $TI^{SLICE}$ and acquisition duration of a slice (using fast imaging methods like echo-planar readout, for example) is approximately 50 ms, in this example. For 25 slices, the difference between the first and last slice in $TI^{SLICE}$ is 24×50 ms=1200 ms, which system 10 takes into account for proper quantification. In FIG. 2c, $TI^{SLICE\_1}$=1500 ms for the first slice and $TI^{SLICE\_25}$=2700 ms for the last slice.

System 10 adapts PASL acquisition by selecting (and in one embodiment, alternating) between different slice acquisition order used in combining and averaging image data representing the same corresponding image slice in both first and second image sets that are acquired at different times relative to a time of blood tagging of a patient. System 10 modifies PASL acquisition by use of additional multiple different TI values (and use of modified, $\Delta TI^{SLICE}$ values) that modify the values shown in the timing arrangement of FIGS. 2a, 2b and 2c. Image data processor 34 compensates for differences in $TI^{SLICE}$ values of perfusion maps by interpolation between different $TI^{SLICE}$ values which results in a new inversion time $TI^{AVERAGE}$ (and corresponding new perfusion maps). Image data processor 34 also provides a quality control metric of a quantitative perfusion map to assess deviation from a standard model (a model perfusion map) and calculates a model validity map in real-time or as an off-line post-processing operation.

Figure 4A:
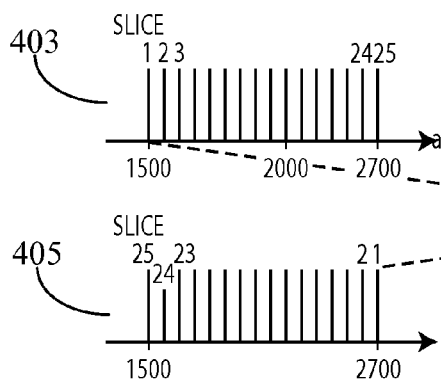
FIGS. 4a and 4b illustrate combining and averaging image data representing the same corresponding image slice in both first and second image sets and acquired at different times relative to time of blood tagging of a patient, according to invention principles.
Figure 4B:
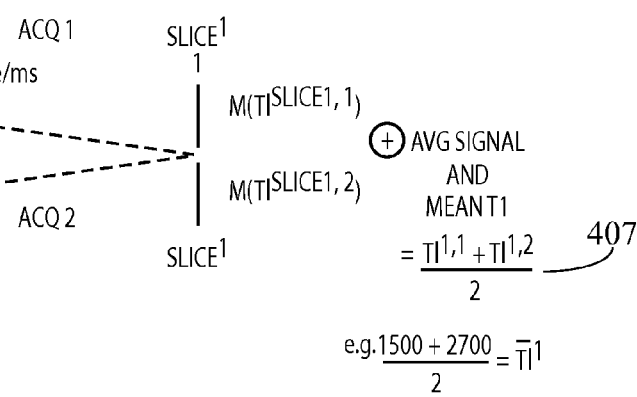

FIGS. 4a and 4b illustrate combining and averaging image data representing the same corresponding image slice in both first and second image sets and acquired at different times relative to time of blood tagging of a patient. Image acquisition is performed by system 10 in this embodiment without need for increased acquisition time using a perfusion-weighted acquisition with alternating slice acquisition order. A first image set 403 of 25 slices is acquired by system 10 with an ascending order, Slc1, Slc2, . . . , Slc25 with $TI^{SLICE\_1,1}$=1500 ms, $TI^{SLICE\_2,1}$=1550 ms, . . . $TI^{SLICE\_25,1}$=2700 ms. A second image set 405 of 25 slices is acquired by system 10 with a descending order, Slc25, Slc24, . . . , Slc1 with $TI^{SLICE\_25,2}$=1500 ms, $TI^{SLICE\_24,2}$=1550 ms, . . . $TI^{SLICE\_1,2}$=2700 ms. Image data processor 34 averages image data representing the same corresponding image slice in both first and second image sets to provide averaged image data at $TI^{AVERAGE}$=($TI^{SLICE\_1,1}$+$TI^{SLICE\_1,2}$)/2 (407) (e.g., at (1500+2700)/2 ms) to provide an averaged image data perfusion map. An individual slice now has multiple (e.g. 2 here) average perfusion images with different $TI^{SLICE}$ times, e.g., $TI^{SLICE\_1,1}$=1500 ms and $TI^{SLICE\_1,2}$=2700 ms. The two maps $\Delta M(TI^{SLICE\_1,1})$ and $\Delta M(TI^{SLICE\_1,2})$ and corresponding $TI^{SLICE}$ are interpolated, to provide an average $TI^{AVERAGE}$=($TI^{SLICE\_1,1}$+$TI^{SLICE\_1,2}$)/2 for example. The slices have the same average TI, while SNR (signal to noise ratio) per unit time is preserved. No further correction, as in the standard model, is required because the maps for different slices are quantified with $TI^{AVERAGE}$.

In another embodiment slice acquisition order of a first image set is interleaved and a second image set is both shifted and interleaved. Specifically, a first image set of 25 slices is acquired by system 10 with an interleaved (odd, even) order comprising, Slc1, Slc3, Slc5, . . . , Slc25, Slc2, Slc 4, . . . , Slc24 with $TI^{SLICE\_1,1}$=1500 ms, $TI^{SLICE\_3,1}$=1550 ms, . . . $TI^{SLICE\_24,1}$=2700 ms. A second image set of 25 slices is acquired by system 10 with a shifted and interleaved (even, odd) order comprising, Slc2, Slc4, Slc6, . . . , Slc24, Slc1, Slc 3, . . . , Slc23 with $TI^{SLICE\_2,2}$=1500 ms, $TI^{SLICE\_4,2}$=1550 ms, . . . $TI^{SLICE\_25,2}$=2700 ms. Image data processor 34 averages image data representing the same corresponding image slice in both first and second image sets to provide averaged image data in the manner previously described. In a further embodiment, system 10 alternates order of acquisition of the first and second image sets in providing averaged perfusion maps as previously described.

Figure 5:
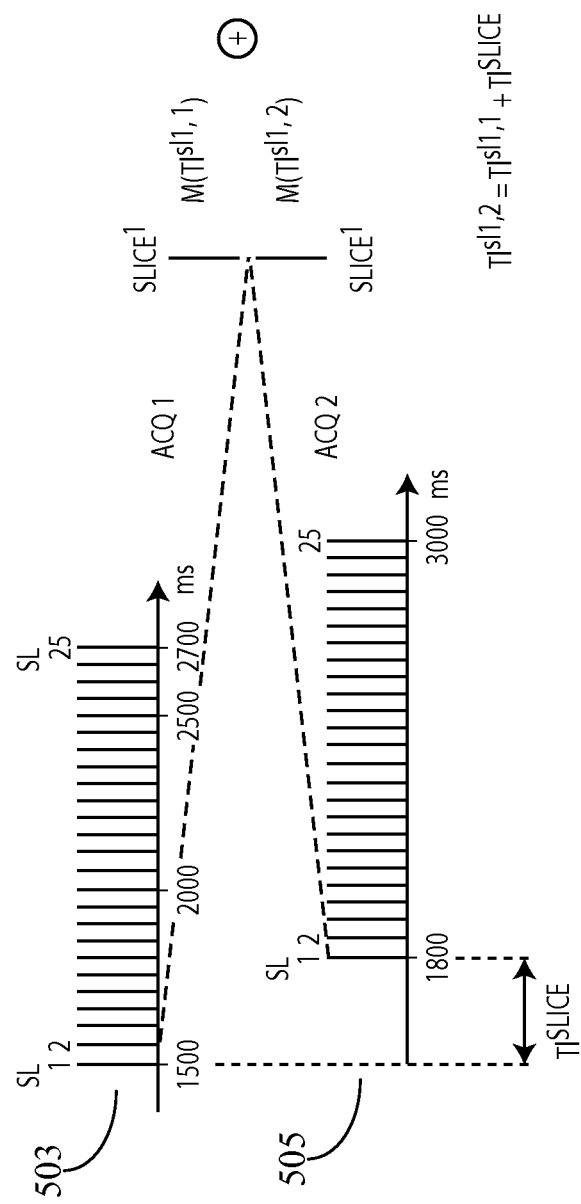
FIG. 5 illustrates combining image data representing the same corresponding image slice in both a first image set and a second image set acquired at times offset relative to times of acquisition of the first set and time of blood tagging of a patient, according to invention principles.

FIG. 5 illustrates combining image data representing the same corresponding image slice in both a first image set and a second image set acquired at times offset relative to times of acquisition of the first set and time of blood tagging of a patient. The image acquisition performed by system 10 in this embodiment involves increased acquisition time using a perfusion-weighted acquisition alternating acquisition of two different $TI^{SLICE}$ times with a difference of for example $\Delta TI^{SLICE}$=300 ms, i.e., the acquisition time is increased by 300 ms. Specifically, a first image set 503 of 25 slices is acquired by system 10 comprising, $TI^{SLICE\_1,1}$=1500 ms, $TI^{SLICE\_2,1}$=1550 ms, . . . $TI^{SLICE\_25,1}$=2700 ms. A second image set 505 of 25 slices is acquired by system 10 comprising, $TI^{SLICE\_1,2}$=1800 ms, $TI^{SLICE\_2,2}$=1850 ms . . . $TI^{SLICE\_25,2}$=3000 ms. Image data processor 34 averages image data representing the same corresponding image slice in both first and second image sets to provide averaged image data in the manner previously described. If slices are acquired in sequential first and second image sets, the total acquisition time would be doubled.

In a different embodiment, image acquisition is performed by system 10 without increased acquisition time but by compromising on the number of slices using a perfusion-weighted acquisition. A first image set of a reduced number of slices (e.g., 6 slices) is repetitively and sequentially acquired 3 times, for example. Similarly, a second image set of the reduced number of slices (6 slices) is repetitively and sequentially acquired for 3 times. This results in acquisition of multiple sets of different $TI^{SLICE}$ times with a difference of for example $\Delta TI^{SLICE}$=300 ms. Typically the slice coverage is reduced, e.g. to 6 slices depending on the number of slice that fit into $\Delta TI^{SLICE}$. A first image set is acquired by system 10 comprising, (slice package 1): $TI^{SLICE\_1,1}$=1500 ms, $TI^{SLICE\_2,1}$=1550 ms, . . . $TI^{SLICE\_6,1}$=1750 ms.
(slice package 2): $TI^{SLICE\_1,2}$=1800 ms, $TI^{SLICE\_2,2}$=1850 ms, . . . $TI^{SLICE\_6,2}$=2050 ms.
(slice package 3): $TI^{SLICE\_1,3}$=2100 ms, $TI^{SLICE\_2,3}$=2150 ms, . . . $TI^{SLICE\_6,3}$=2350 ms.

A second image set is acquired by system 10 comprising,
(slice package 4): $TI^{SLICE\_6,4}$=1500 ms . . . $TI^{SLICE\_2,4}$=1550 ms, $TI^{SLICE\_1,4}$=1750 ms.
(slice package 5): $TI^{SLICE\_6,5}$=1800 ms . . . $TI^{SLICE\_2,5}$=1850 ms, $TI^{SLICE\_1,5}$=2050 ms.
(slice package 6): $TI^{SLICE\_6,6}$=2100 ms . . . $TI^{SLICE\_2,6}$=2150 ms, $TI^{SLICE\_1,6}$=2350 ms.

Image data processor 34 averages image data representing the same corresponding image slice in the three slice packages of both first and second image sets so an averaged image slice is derived from 6 slices e.g., $$(TI^{SLICE\_1,1}+TI^{SLICE\_1,2}+TI^{SLICE\_1,3}+TI^{SLICE\_1,4}+TI^{SLICE\_1,5}+TI^{SLICE\_1,6})/6,$$

to provide averaged slice image data. Using multiple different sets of slices in this manner maintains or reduces total acquisition time but the total number of slices is reduced.

Figure 3A:
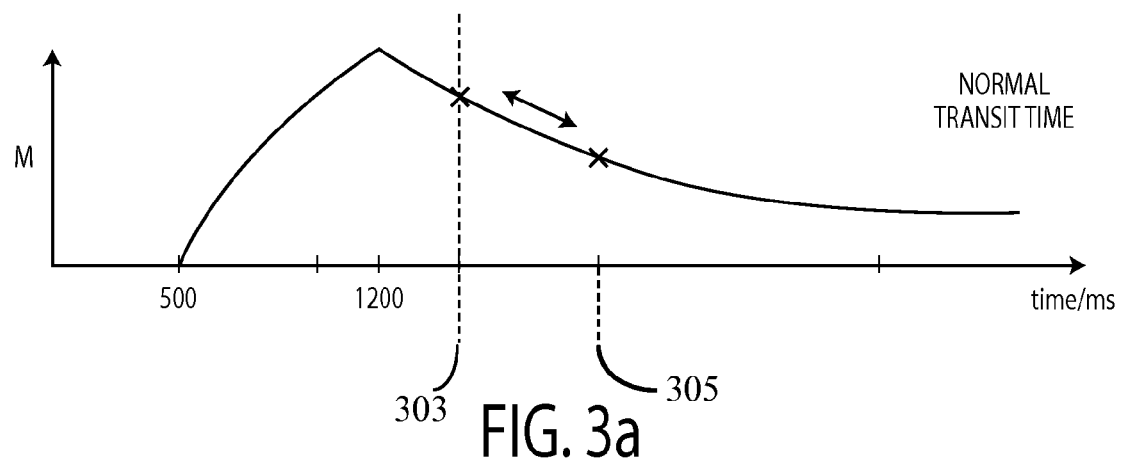
FIGS. 3a and 3b show two difference inversion time (TI) dependent CBF curves, according to invention principles.
Figure 3B:
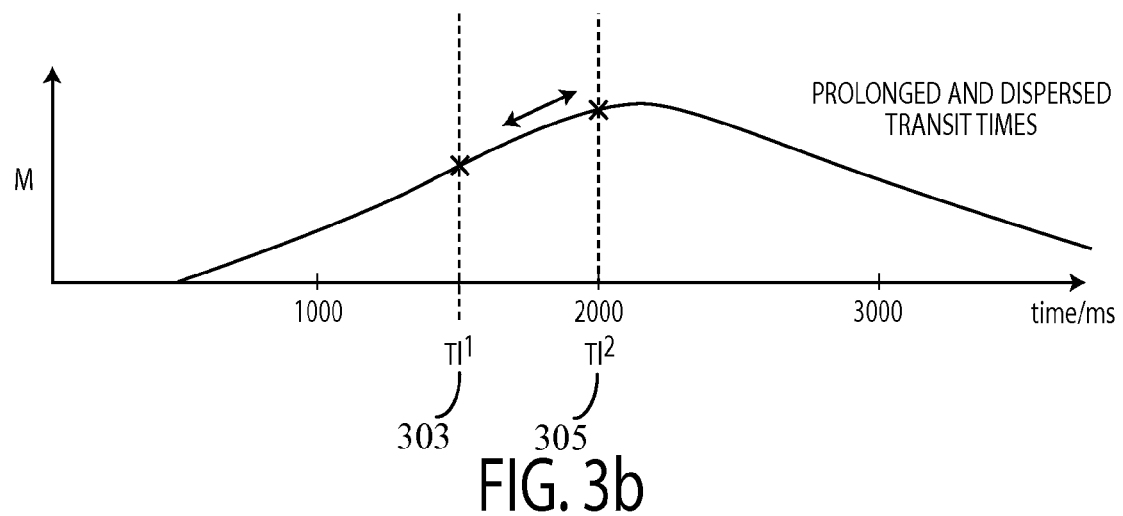

FIGS. 3a and 3b show two difference inversion time (TI) dependent CBF curves following arterial spin labelling of a neck slice. FIG. 3a shows a normal transit time curve indicating blood flow into a brain slice following arterial spin labelling of a neck slice. FIG. 3b shows a transit time curve indicating prolonged and dispersed blood flow into a brain slice following arterial spin labelling of a neck slice. A model validity indicator is calculated from the CBF maps at different $TI^{SLICE}$ values 303 and 305. A difference in CBF at different $TI^{SLICE}$ is indicated in a ratio (A/B) referenced to a standard model. Specifically, $A = \Delta M(TI^{SLICE-1,2})/\Delta M(TI^{SLICE-1,1})$ compared to $B = \exp(-(TI^{SLICE-1,2} - TI^{SLICE-1,1})/T1')$ [standard model].

A model validity ratio (A/B) near 1 indicates that time of peak blood flow is less than $TI^{SLICE-1}$ and that assumptions of the standard model are valid. A model validity ratio deviating from unity (substantially greater than 1 or substantially less than 1) indicates that time of peak blood flow exceeds ($TI^{SLICE-1} - \tau$) and that CBF quantification values are underestimated in corresponding voxels. This spatial indicator model validity index comprises a quality indicator for use in clinical practice. For example, model validity index for the curve of FIG. 3a is approximately equal to 1, whereas model validity index for the curve of FIG. 3b is substantially less than 1.

System 10 advantageously compensates for different TI values of different slices by use of an altered slice acquisition order without need for prior knowledge and assumptions of a known (standard) model. System 10 preserves SNR at corresponding measurement times and provides a model validity indicator indicating validity compared to the known model. Further, spatial deviation in a derived perfusion map hints at brain areas with prolonged blood flow transit time, indicating false CBF quantification. System 10 provides real time compensation for different TI values of different slices together with a model validity indicator during image scanning that is usable for automatic and interactive quality control. In one embodiment, system 10 uses additional imaging time with multiple TI values (e.g. two different TI values) in providing a map of model validity for slices of similar quality.

FIG. 6 shows a flowchart of a process performed by system 10 for adaptively processing MR image data to accommodate variation in perfusion time of a vessel fluid. In step 612 following the start at step 611, image acquisition device 25 acquires a first image set comprising multiple different individual images having a set of corresponding different physical slice locations through a patient anatomical volume. Image acquisition device 25 acquires the first image set at a corresponding first set of times (e.g., a first set of inversion times) and in a first order relative to a time of blood tagging of a patient. In step 615, image acquisition device 25 acquires a second image set comprising multiple different individual images having the set of corresponding different physical slice locations through the patient anatomical volume. The corresponding first set of times of acquisition of the multiple different individual images comprise times separated by substantially equal time increments and the second order is substantially inverse to the first order. Image acquisition device 25 acquires the second image set at the corresponding first set of times and in a second order, different to the first order, relative to the time of blood tagging of the patient. In one embodiment, system 10 is employed in PASL (pulsed arterial spin labeling of blood in the neck of the patient, for example) involving blood tagging (and a time of blood tagging) of the patient. In another embodiment system 10 uses a contrast agent for tagging blood and a time of blood tagging comprises a time of introduction of a contrast agent.

In one embodiment, individual images in the first image set are divided into interleaved odd and even sets. The individual images in the second image set are divided into odd and even sets and the first order and the second order comprise acquisition of an odd or even set first. Also, at least one of, (a) the first order comprises acquisition of an odd set first and the second order comprise acquisition of an even set first and (b) the first order comprises acquisition of an even set first and the second order comprise acquisition of an odd set first. The MR image data acquisition device initiates acquisition of the second image set at substantially a corresponding first set of times offset by a first predetermined fixed time increment relative to the time of blood tagging of the patient. The MR image data acquisition device initiates acquisition of a third image set at substantially a corresponding first set of times offset by a second predetermined fixed time increment relative to the time of blood tagging of the patient. The second predetermined fixed time increment exceeding the first predetermined fixed time increment. Image data processor 34 combines and averages image data representing the same corresponding image slice in the first, second and third image sets and acquired at different times relative to the time of blood tagging of the patient. The MR image data acquisition device adaptively reduces the number of image slices taken in the first and second image sets in response to selection of an acquisition device mode comprising initiating acquisition of an image set at times offset by a predetermined fixed time increment relative to the time of blood tagging of the patient.

In step 623 image data processor 34 combines and averages image data representing the same corresponding image slice in both the first and second image sets and acquired at different times relative to the time of blood tagging of the patient. Image data processor 34 in step 625, interpolates image data representing the same corresponding image slice in both the first and second image sets and acquired at different times relative to the time of blood tagging of the patient, to provide data representing an interpolated image slice corresponding to a time of acquisition between the different times relative to the time of blood tagging of the patient. In step 627 image data processor 34 determines a factor representative of quality of combined and averaged image data representing the same corresponding image slice based on a ratio of relative degree of contrast agent perfusion occurring at the different acquisition times relative to the time of blood tagging of the patient of the data representing the same corresponding image slice in both the first and second image sets. In one embodiment the factor representative of quality is of the form $$\Delta M(\text{time\_of\_}^{SLICE-1,2})/\Delta M(\text{time\_of\_}^{SLICE-1,1})$$

Where, $\Delta M$ is change in perfusion at different times for a given image and values of the factor near unity represent accordance with a standard model and values substantially divergent from unity represent deviation from the standard model. In step 629 image data processor 34 sends the combined and averaged image data representing the same corresponding image slice to a destination.

The process of FIG. 6 terminates at step 631.

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a controller or microprocessor, for example, and is conditioned using executable instructions to perform special purpose functions not performed by a general purpose computer. A processor may be coupled (electrically and/or as comprising executable components) with any other processor enabling interaction and/or communication there-between. A display processor or generator is a known element comprising electronic circuitry or software or a combination of both for generating display images or portions thereof.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A user interface (UI), as used herein, comprises one or more display images, generated by a display processor and enabling user interaction with a processor or other device and associated data acquisition and processing functions.

The UI also includes an executable procedure or executable application. The executable procedure or executable application conditions the display processor to generate signals representing the UI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity. The system and processes of FIGS. 1-6 are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. The perfusion adaptive MR Imaging System 10 employs a compensation method for variation in blood flow transit times in image slices and provides a TI compensation and perfusion validity indicator for use in reducing artefacts resulting from prolonged bolus transit time effects. Further, the processes and applications may, in alternative embodiments, be located on one or more (e.g., distributed) processing devices on the network of FIG. 1. Any of the functions and steps provided in FIGS. 1-6 may be implemented in hardware, software or a combination of both.

What is claimed is:

1. A magnetic resonance imaging (MRI) system configured for adaptively processing MR image data in order to accommodate variation in perfusion time of a vessel fluid, comprising:
    an MR image data acquisition device that in response to blood proton spin tagging, initiates acquisition of,
        a first image set comprising a plurality of different individual blood proton spin tagged images having a set of corresponding different physical slice locations through a patient anatomical volume and being acquired at a corresponding first set of times and in a first order with respect to a time of blood tagging of a patient and
        a second image set comprising a plurality of different individual blood proton spin tagged images having said set of corresponding different physical slice locations through said patient anatomical volume and being acquired at substantially said corresponding first set of times and in a second order, different to said first order, with respect to said time of blood tagging of said patient; and
    at least one computer configured for,
        combining and averaging blood proton spin tagged image data representing the same corresponding image slice in both the first and second image sets and acquired at different times following said time of blood tagging of said patient and with different degree of blood tagging perfusion and
        sending the combined and averaged image data representing the same corresponding image slice to a destination from which the combined and averaged image data is accessible as an MRI image.

2. A magnetic resonance imaging (MRI) system according to claim 1, wherein
    said corresponding first set of times of acquisition of said plurality of different individual blood proton spin tagged images comprise times separated by substantially equal time increments.

3. A magnetic resonance imaging (MRI) according to claim 1, wherein said second order is substantially inverse to said first order.

4. A magnetic resonance imaging (MRI) system according to claim 1, wherein
    said individual blood proton spin tagged images in said first image set are divided into interleaved odd and even sets, and
    said individual blood proton spin tagged images in said second image set are divided into odd and even sets and said first order and said second order comprise acquisition of an odd or even set first.

5. A magnetic resonance imaging (MRI) system according to claim 4, wherein at least one of,
    (a) said first order comprises acquisition of an odd set first and said second order comprise acquisition of an even set first and
    (b) said first order comprises acquisition of an even set first and said second order comprise acquisition of an odd set first.

6. A magnetic resonance imaging (MRI) system according to claim 1, wherein
    said MR image data acquisition device initiates acquisition of said second image set at substantially a corresponding first set of times offset by a first predetermined fixed time increment following said time of blood tagging of said patient.

7. A magnetic resonance imaging (MRI) system according to claim 6, wherein
   said MR image data acquisition device initiates acquisition of a third image set at substantially a corresponding first set of times offset by a second predetermined fixed time increment following said time of blood tagging of said patient, said second predetermined fixed time increment exceeding said first predetermined fixed time increment and
   said at least one computer combines and averages image data representing the same corresponding image slice in the first, second and third image sets and acquired at different times following said time of blood tagging of said patient.

8. A magnetic resonance imaging (MRI) system according to claim 7, wherein
   said MR image data acquisition device adaptively reduces the number of image slices taken in the first and second image sets in response to a user selection of an acquisition device mode comprising initiating acquisition of an image set at times offset by a predetermined fixed time increment following said time of blood tagging of said patient.

9. A magnetic resonance imaging (MRI) system according to claim 1, wherein
   said at least one computer interpolates image data representing the same corresponding image slice in both the first and second image sets and acquired at different times following said time of blood tagging of said patient, in order to provide data representing an interpolated image slice corresponding to a time of acquisition between the different times following said time of blood tagging of said patient.

10. A magnetic resonance imaging (MRI) system according to claim 1, wherein
    said at least one computer determines a factor representative of quality of combined and averaged image data representing the same corresponding image slice based on a ratio of relative degree of contrast agent perfusion occurring at the different acquisition times following said time of blood tagging of said patient of the data representing the same corresponding image slice in both the first and second image sets.

11. A magnetic resonance imaging (MRI) system according to claim 10, wherein
    said factor representative of quality is of the form $\Delta M(time\_of\_{SLICE-1,2})/\Delta M(time\_of\_{SLICE-1,1})$ where, $\Delta M$ is change in perfusion at different times for a given image.

12. A magnetic resonance imaging (MRI) system according to claim 11, wherein values of said factor near unity represent accordance with a standard model and values substantially divergent from unity represent deviation from the standard model.

13. A magnetic resonance imaging (MRI) system according to claim 1, wherein said blood tagging of said patient comprises arterial spin labeling of blood of said patient.

14. A magnetic resonance imaging (MRI) system according to claim 13, wherein said blood tagging of said patient comprises arterial spin labeling of blood in the neck of said patient.

15. A magnetic resonance imaging (MRI) system according to claim 1, wherein said first set of times comprise a first set of inversion times.

16. A magnetic resonance imaging (MRI) system configured for adaptively processing MR image data in order to accommodate variation in perfusion time of a vessel fluid, comprising:
    an MR image data acquisition device that in response to an introduction of a contrast agent into a patient, initiates acquisition of,
      a first image set comprising a plurality of different individual blood proton spin tagged images having a set of corresponding different physical slice locations through a patient anatomical volume and being acquired at a corresponding first set of times and in a first order with respect to a time of introduction of a contrast agent into a patient and
      a second image set comprising a plurality of different individual images having said set of corresponding different physical slice locations through said patient anatomical volume and being acquired at substantially said corresponding first set of times and in a second order, different to said first order, with respect to a time of introduction of a contrast agent into a patient; and
    at least one computer configured for,
      combining and averaging blood proton spin tagged image data representing the same corresponding image slice in both the first and second image sets and acquired at different times following a time of introduction of a contrast agent into a patient and with different degree of contrast agent perfusion and
      sending the combined and averaged image data representing the same corresponding image slice to a destination from which the combined and averaged image data is accessible as an MRI image.

17. A method employed by an MR imaging system configured for adaptively processing MR image data in order to accommodate variation in perfusion time of a vessel fluid, comprising the activities of:
    in response to blood proton spin tagging,
      acquiring, with the MR imaging system, a first image set comprising a plurality of different individual blood proton spin tagged images having a set of corresponding different physical slice locations through a patient anatomical volume and being acquired at a corresponding first set of times and in a first order with respect to a time of blood tagging of a patient and
      acquiring with the MR imaging system, a second image set comprising a plurality of different individual blood proton spin tagged images having said set of corresponding different physical slice locations through said patient anatomical volume and being acquired at substantially said corresponding first set of times and in a second order, different to said first order, with respect to said time of blood tagging of said patient;
    combining and averaging, within a computer, blood proton spin tagged image data representing the same corresponding image slice in both the first and second image sets and acquired at different times following said time of blood tagging of said patient and with different degree of blood tagging perfusion; and
    sending the combined and averaged image data representing the same corresponding image slice to a destination from which the combined and averaged image data is accessible as an MRI image.

18. A method according to claim 17, wherein said corresponding first set of times of acquisition of said plurality of different individual blood proton spin tagged images comprise times separated by substantially equal time increments.

19. A method according to claim 17, wherein said second order is substantially inverse to said first order.

* * * * *